(12) United States Patent
Mou et al.

(10) Patent No.: US 11,731,423 B2
(45) Date of Patent: Aug. 22, 2023

(54) WAFER STRUCTURE

(71) Applicant: Microjet Technology Co., Ltd., Hsinchu (TW)

(72) Inventors: Hao-Jan Mou, Hsinchu (TW); Ying-Lun Chang, Hsinchu (TW); Hsien-Chung Tai, Hsinchu (TW); Yung-Lung Han, Hsinchu (TW); Chi-Feng Huang, Hsinchu (TW); Chun-Yi Kuo, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 17/405,874

(22) Filed: Aug. 18, 2021

(65) Prior Publication Data
US 2022/0161555 A1     May 26, 2022

(30) Foreign Application Priority Data
Nov. 24, 2020    (TW) ................................ 109141081

(51) Int. Cl.
| | |
|---|---|
| *B41J 2/14* | (2006.01) |
| *B41J 2/16* | (2006.01) |
| *H01L 29/423* | (2006.01) |
| *B41J 2/045* | (2006.01) |
| *B41J 2/175* | (2006.01) |

(52) U.S. Cl.
CPC ......... *B41J 2/14016* (2013.01); *B41J 2/1606* (2013.01); *H01L 29/42372* (2013.01); *B41J 2/0458* (2013.01); *B41J 2/1635* (2013.01); *B41J 2/175* (2013.01); *B41J 2202/13* (2013.01)

(58) Field of Classification Search
CPC .... B41J 2/14016; B41J 2/1606; B41J 2/0458; B41J 2/1635; B41J 2/175
See application file for complete search history.

(56) References Cited

U.S. PATENT DOCUMENTS

| | | | |
|---|---|---|---|
| 7,090,340 B2 * | 8/2006 | Tobita | B41J 2/045 347/68 |
| 9,776,402 B2 * | 10/2017 | White | B41J 2/1628 |

(Continued)

FOREIGN PATENT DOCUMENTS

TW     200831298 A     8/2008

*Primary Examiner* — Jason S Uhlenhake
(74) *Attorney, Agent, or Firm* — Birch, Stewart, Kolasch & Birch, LLP

(57) ABSTRACT

A wafer structure is disclosed and includes a chip substrate and plural inkjet chips having plural ink-drip generators. Each ink-drop generator includes a thermal-barrier layer, a resistance heating layer and a protective layer. The thermal-barrier layer is formed on the chip substrate, the resistance heating layer is formed on the thermal-barrier layer, a part of the protective layer is formed on the resistance heating layer, and the barrier layer is formed on the protective layer. The ink-supply chamber has a bottom in communication with the protective layer, and a top in communication with the nozzle. The thermal-barrier layer has a thickness of 500~5000 angstroms, the protective layer has a thickness of 150~3500 angstroms, the resistance heating layer has a thickness of 100~500 angstroms, the resistance heating layer has a length of 5~30 microns, and the resistance heating layer has a width of 5~10 microns.

18 Claims, 10 Drawing Sheets

(56) References Cited

U.S. PATENT DOCUMENTS

| | | |
|---|---|---|
| 2003/0117462 A1 | 6/2003 | Cleland et al. |
| 2004/0021740 A1 | 2/2004 | Bell et al. |
| 2012/0075383 A1* | 3/2012 | Fang ............... B41J 2/1628 347/42 |
| 2014/0340452 A1* | 11/2014 | Kunnavakkam ..... B41J 2/14072 347/62 |

* cited by examiner

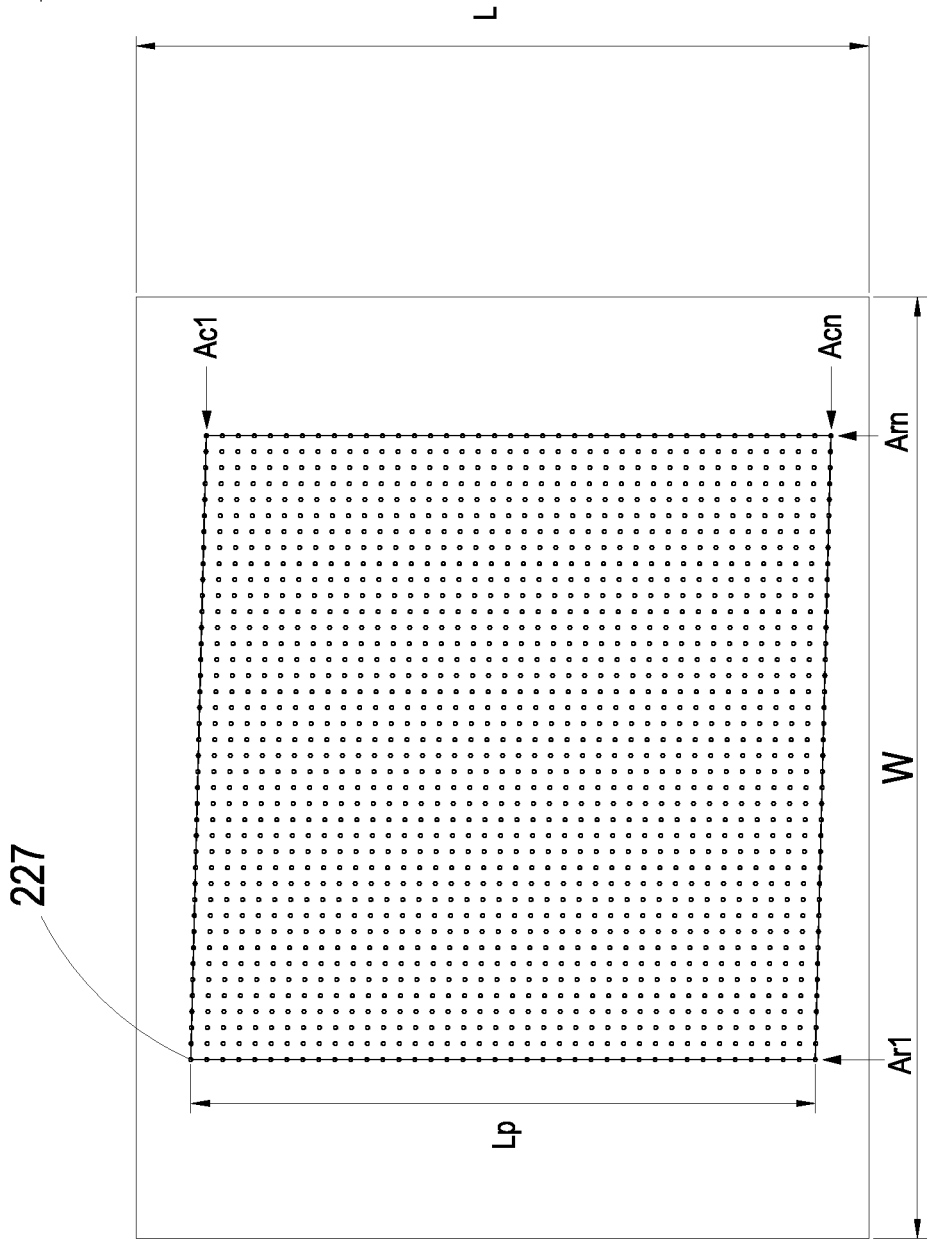

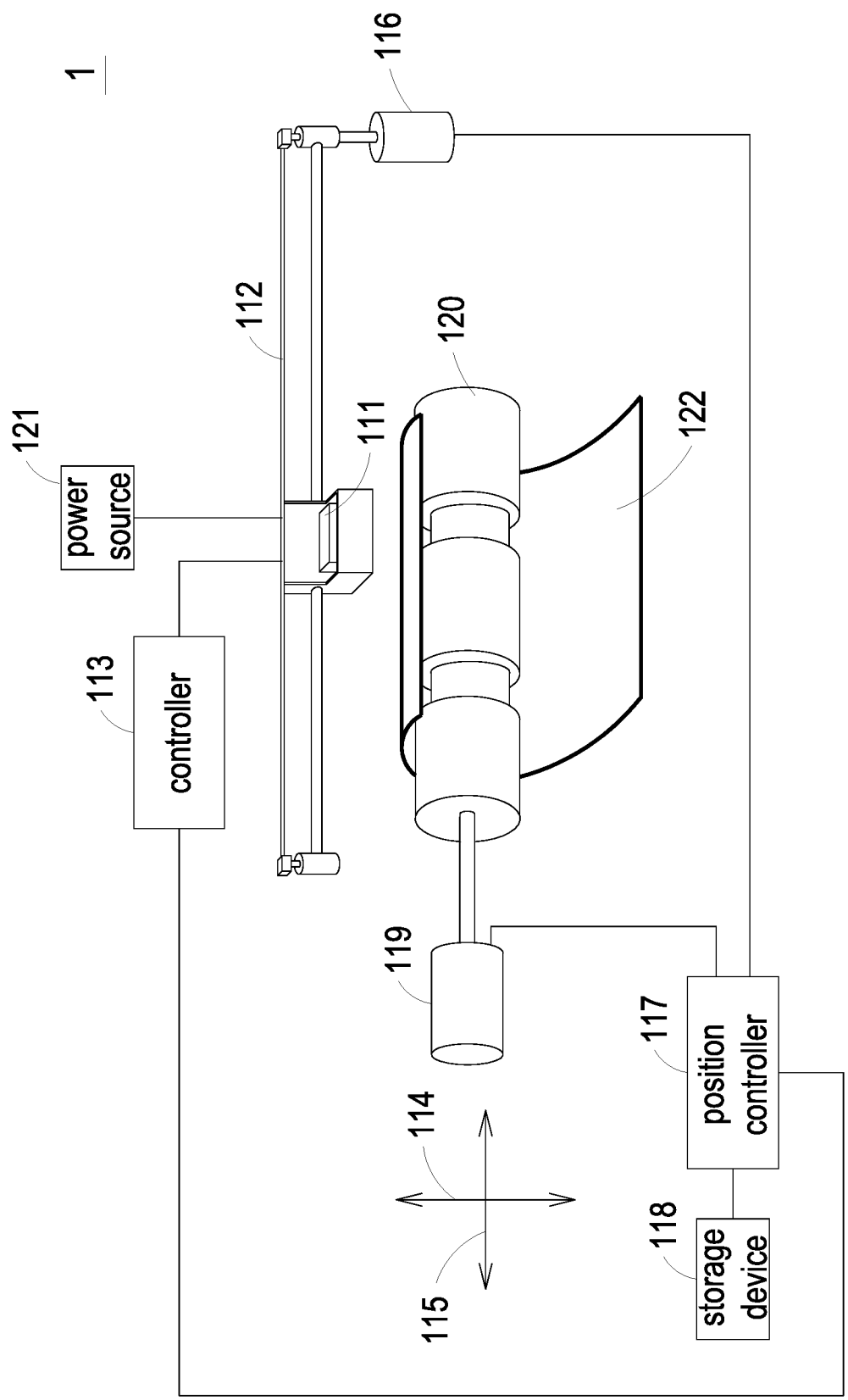

WAFER STRUCTURE

FIELD OF THE INVENTION

The present disclosure relates to a wafer structure, and more particularly to a wafer structure fabricated by a semiconductor process and applied to an inkjet chip for inkjet printing.

BACKGROUND OF THE INVENTION

In addition to a laser printer, an inkjet printer is another model that is commonly and widely used in the current market of the printers. The inkjet printer has the advantages of low price, easy to operate and low noise. Moreover, the inkjet printer is capable of printing on various printing media, such as paper and photo paper. The printing quality of an inkjet printer mainly depends on the design factors of an ink cartridge. In particular, the design factor of an inkjet chip releasing ink droplets to the printing medium is regarded as an important consideration in the design factors of the ink cartridge.

In addition, as the inkjet chip is pursuing the printing quality requirements of higher resolution and higher printing speed, the price of the inkjet printer has dropped very fast in the highly competitive inkjet printing market. Therefore, the manufacturing cost of the inkjet chip combined with the ink cartridge and the design cost of higher resolution and higher printing speed are key factors for market competitiveness.

As shown in FIG. 1, the inkjet chip produced in the current inkjet printing market is made from a wafer structure by a semiconductor process. The conventional inkjet chip is all fabricated with the wafer structure of less than 6 inches. However, an ink-drop generator 1' of the inkjet chip manufactured by a semiconductor process is covered by a nozzle plate 11' thereon after it is fabricated. The nozzle plate 11' has at least one nozzle 111' passing therethrough, and the nozzle 111' is corresponding to an ink-supply chamber 1a' of the ink droplet generator 1', such that the heated ink contained in the ink-supply chamber 1a' can be ejected through the nozzle 111' and printed on the printing medium. Therefore, the design of the nozzle plate 11' requires an additional process procedure for pre-fabricating the nozzle 111', and is not capable to fabricate the nozzle 111' on the nozzle plate 11' with the ink drop generator 1' of the inkjet chip by semiconductor process at the same time. Consequently, this manufacturing process not only increase the cost, but the nozzle 111' also has to be precisely aligned to the position of the ink-supply chamber 1a'. A high accuracy is required to achieve the purpose of covering the nozzle plate 11' on the ink drop generator 1' of the inkjet chip correspondingly. The manufacturing cost of the inkjet chip manufactured in such way is high. It is also a key factor results that the manufacturing cost of the inkjet chip is not competitive in the market.

Moreover, the conventional inkjet chip is all fabricated with the wafer structure of less than 6 inches. In the pursuit of higher resolution and higher printing speed at the same time, the design of the printing swath of the inkjet chip needs to be larger and longer, so as to greatly increase the printing speed. In this way, the overall area required for the inkjet chip become larger. Therefore, the number of inkjet chips required to be manufactured on a wafer structure within a limited area of less than 6 inches become quite limited, and the manufacturing cost also cannot be effectively reduced.

For example, the printing swath of an inkjet chip produced from a wafer structure of less than 6 inches is 0.56 inches, and can be diced to generate 334 inkjet chips at most. Furthermore, if the inkjet chip having the printing swath more than 1 inch or meeting the printing swath of one A4 page width (8.3 inches) to obtain the printing quality requirements of higher resolution and higher printing speed is produced in the wafer structure of less than 6 inches, the number of inkjet chips required produced on the wafer structure within the limited area less than 6 inches is quite limited, and the obtained number thereof is even smaller. This will result in wasted remaining blank area on the wafer structure with the limited area of less than 6 inches, which occupy more than 20% of the entire area of the wafer structure, and it is quite wasteful. Furthermore, the manufacturing cost cannot be effectively reduced.

Therefore, how to meet the object of pursuing lower manufacturing cost of the inkjet chip in the inkjet printing market, higher resolution, and higher printing speed is a main issue of concern developed in the present disclosure.

SUMMARY OF THE INVENTION

An object of the present disclosure is to provide a wafer structure including a chip substrate and a plurality of inkjet chips. The chip substrate is fabricated by a semiconductor process, so that more required inkjet chips can be arranged on the chip substrate. Furthermore, a first inkjet chip and a second inkjet chip having different sizes of printing swath can be directly generated in the same inkjet chip semiconductor process. As a result, a plurality of ink-drop generators are produced by the semiconductor process at the same time. Additionally, each ink-drop generator has an ink-supply chamber and a nozzle integrally formed in a barrier layer, thus this semiconductor process for the inkjet chips is suitable for arranging printing inkjet design of higher resolution and higher performance, and dicing into the first inkjet chip and the second inkjet chip used in inkjet printing to achieve the object of lower manufacturing cost of the inkjet chips and pursuing the printing quality of higher resolution and higher printing speed.

In accordance with an aspect of the present disclosure, a wafer structure is provided and includes a chip substrate and a plurality of inkjet chips. The chip substrate is a silicon substrate fabricated by a semiconductor process. The plurality of inkjet chips include at least one first inkjet chip and at least one second inkjet chip directly formed on the chip substrate by the semiconductor process, respectively, and the plurality of inkjet chips are diced into the at least one first inkjet chip and the at least one second inkjet chip for inkjet printing. Each of the first inkjet chip and the second inkjet chip includes a plurality of ink-drop generators produced by a semiconductor process and formed on the chip substrate. Each of the ink-drop generators includes a barrier layer, an ink-supply chamber and a nozzle, and the ink-supply chamber and the nozzle are integrally formed in the barrier layer. Each of the ink-drop generators further includes a thermal-barrier layer, a resistance heating layer and a protective layer. The thermal-barrier layer is formed on the chip substrate, the resistance heating layer is formed on the thermal-barrier layer, a part of the protective layer is formed on the resistance heating layer, and the barrier layer is formed on the protective layer. The ink-supply chamber has a bottom in communication with the protective layer and a top in communication with the nozzle. The thermal-barrier layer has a thickness ranging from 500 angstroms to 5000 angstroms, the protective layer has a thickness ranging from 150 angstroms to 3500 angstroms, the resistance heating layer has a thickness ranging from 100 angstroms to 500 angstroms, the resistance heating layer has a length ranging from 5 microns to 30 microns, and the resistance heating layer has a width ranging from 5 microns to 10 microns.

BRIEF DESCRIPTION OF THE DRAWINGS

The above contents of the present disclosure will become more readily apparent to those ordinarily skilled in the art after reviewing the following detailed description and accompanying drawings, in which:

FIG. 4D is a schematic view illustrating the ink-supply channels and the elements of the conductive layer arranged on the inkjet chip of the wafer structure according to another embodiment of the present disclosure;

FIG. 7 is a schematic view illustrating an internal carrying system applied to an inkjet printer.

DETAILED DESCRIPTION OF THE PREFERRED EMBODIMENT

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
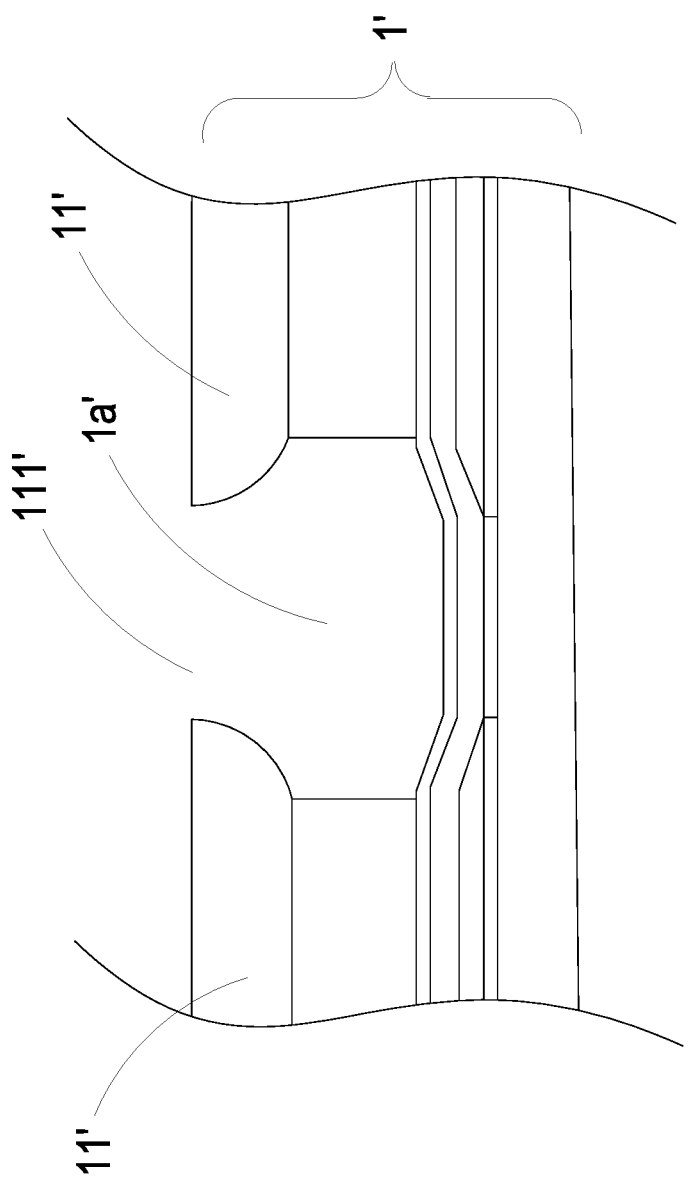
FIG. 1 is a schematic cross-sectional view illustrating an ink-drop generator according to the prior art.
Figure 2:
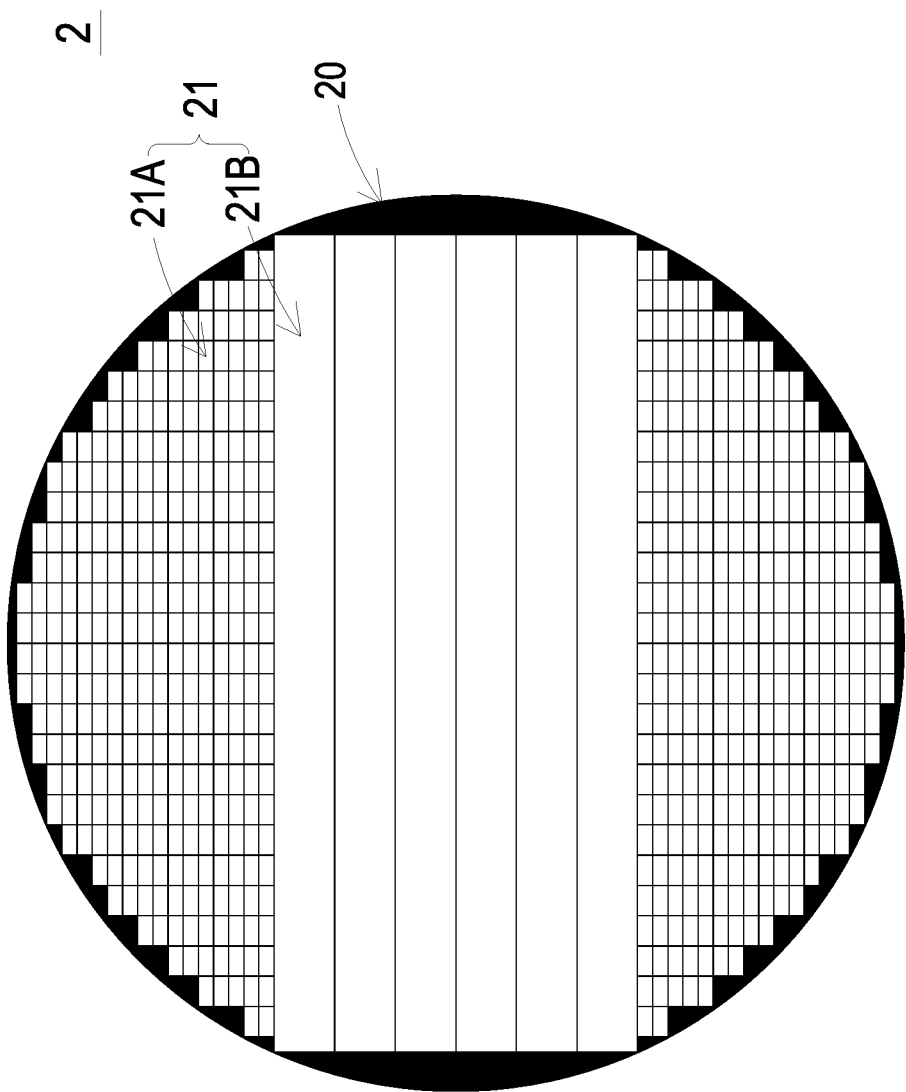
FIG. 2 is a schematic view illustrating a wafer structure according to an embodiment of the present disclosure.

Please refer to FIG. 2. The present disclosure provides a wafer structure 2. The wafer structure 2 includes a chip substrate 20 and a plurality of inkjet chips 21. Preferably but not exclusively, the chip substrate 20 is a silicon substrate and fabricated by a semiconductor process. In an embodiment, the chip substrate 20 is fabricated by the semiconductor process on a 12-inch wafer. In another embodiment, the chip substrate 20 is fabricated by the semiconductor process on a 16-inch wafer.

Figure 3:
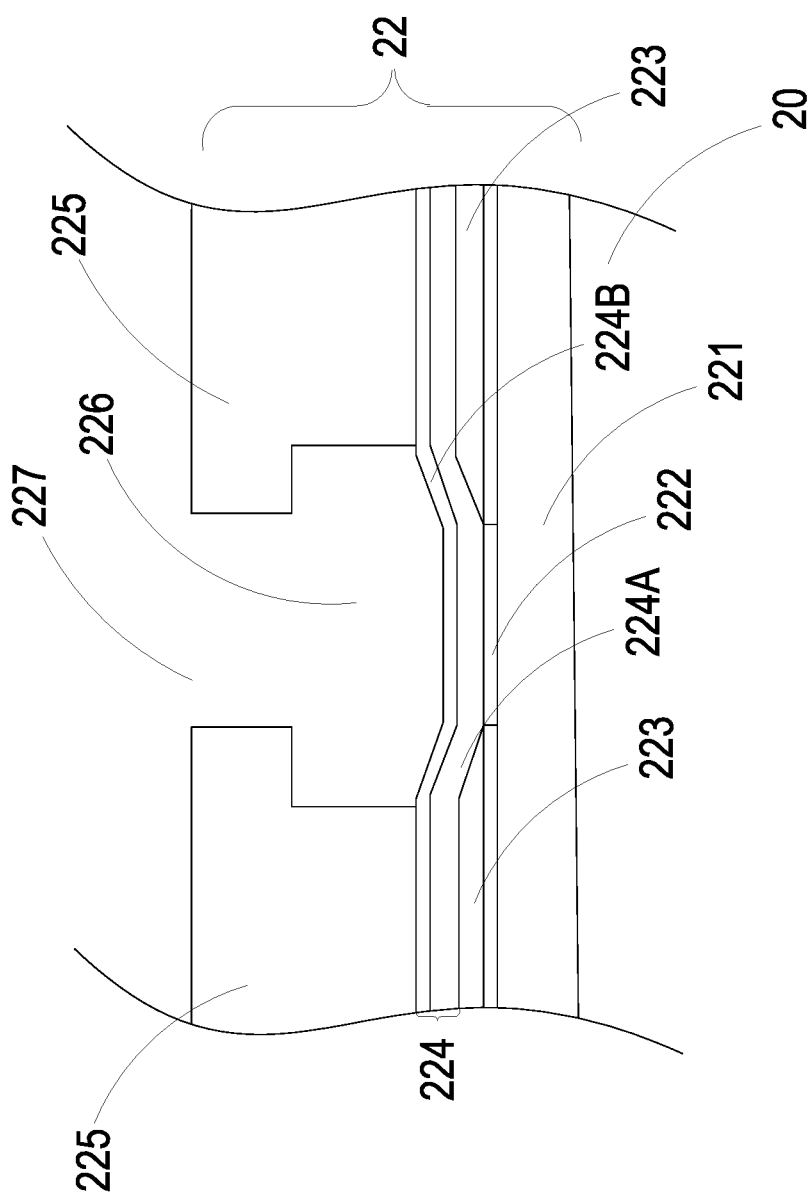
FIG. 3 is a schematic cross-sectional view illustrating the ink-drop generators on the wafer structure according to the embodiment of the present disclosure.

In the embodiment, the plurality of inkjet chips 21 include at least one first inkjet chip 21A and at least one second inkjet chip 21B directly formed on the chip substrate 20 by the semiconductor process, and the inkjet chips 21 are diced into the at least one first inkjet chip 21A and at least one second inkjet chip 21B for a printhead 111. In the embodiment, each of the first inkjet chip 21A and the second inkjet chip 21B includes a plurality of ink-drop generators 22 formed on the chip substrate 20 by the semiconductor process. As shown in FIG. 3, each of the ink-drop generators 22 includes a thermal-barrier layer 221, a resistance heating layer 222, a conductive layer 223, a protective layer 224, a barrier layer 225, an ink-supply chamber 226 and a nozzle 227. In the embodiment, the thermal-barrier layer 221 is formed on the chip substrate 20. The resistance heating layer 222 is formed on the thermal-barrier layer 221. The conductive layer 223 and a part of the protective layer 224 are formed on the resistance heating layer 222. The rest part of the protective layer 224 is formed on the conductive layer 223. The barrier layer 225 is formed on the protective layer 224. Moreover, the ink-supply chamber 226 and the nozzle 227 are integrally formed in the barrier layer 225. In the embodiment, a bottom of the ink-supply chamber 226 is in communication with the protective layer 224. The top of the ink-supply chamber 226 is in communication with the nozzle 227. In other words, the ink-drop generator 22 of the inkjet chip 21 is fabricated by performing the semiconductor process on the chip substrate 20 as described below. Firstly, a thin film of the thermal-barrier layer 221 is formed on the chip substrate 20, and the heating resistance layer 222 and the conductive layer 223 are successively disposed thereon by sputtering. The required size is defined by the process of photolithography. Afterwards, the protective layer 224 is coated thereon through a sputtering device or a chemical vapor deposition (CVD) device. Then, the ink-supply chamber 226 is formed on the protective layer 224 by compression molding of a polymer film, and the nozzle 227 is formed by compression molding of a polymer film coated thereon, so as to integrally form the barrier layer 225 on the protective layer 224. In this way, the ink-supply chamber 226 and the nozzle 227 are integrally formed in the barrier layer 225. Alternatively, in another embodiment, a polymer film is formed on the protective layer 224 to directly define the ink-supply chamber 226 and the nozzle 227 by a photolithography process. In this way, the ink-supply chamber 226 and the nozzle 227 are also integrally formed in the barrier layer 225. The bottom of the ink-supply chamber 226 is in communication with the protective layer 224, and the top of the ink-supply chamber 226 is in communication with the nozzle 227. In the embodiment, the chip substrate 20 is a silicon substrate. The resistance heating layer 222 is made of a tantalum aluminide (TaAl) material. The conductive layer 223 is made of an aluminum (Al) material. The protective layer 224 is formed by stacking a second protective layer 224B as an under layer and a first protective layer 224A as an upper layer. The first protective layer 224A is made of a silicon nitride ($Si_3N_4$) material. The second protective layer 224B is made of a silicon carbide (SiC) material. The barrier layer 225 is made of a polymer material. Notably, in the embodiment, the thermal-barrier layer 221 has a thickness ranging from 500 angstroms to 5000 angstroms, but not limited thereto. In other embodiment, the thickness of the thermal-barrier layer 221 is adjustable according to the process. Notably, in the embodiment, the protective layer 224 has a thickness ranging from 150 angstroms to 3500 angstroms, but not limited thereto. In other embodiment, the thickness of the protective layer 224 is adjustable according to the requirement for the process. Moreover, notably, in the embodiment, the resistance heating layer 222 has a thickness ranging from 100 angstroms to 500 angstroms, but not limited thereto. In the other embodiment, the thickness of the resistance heating layer 222 is adjustable according to the process.

Figure 4A:
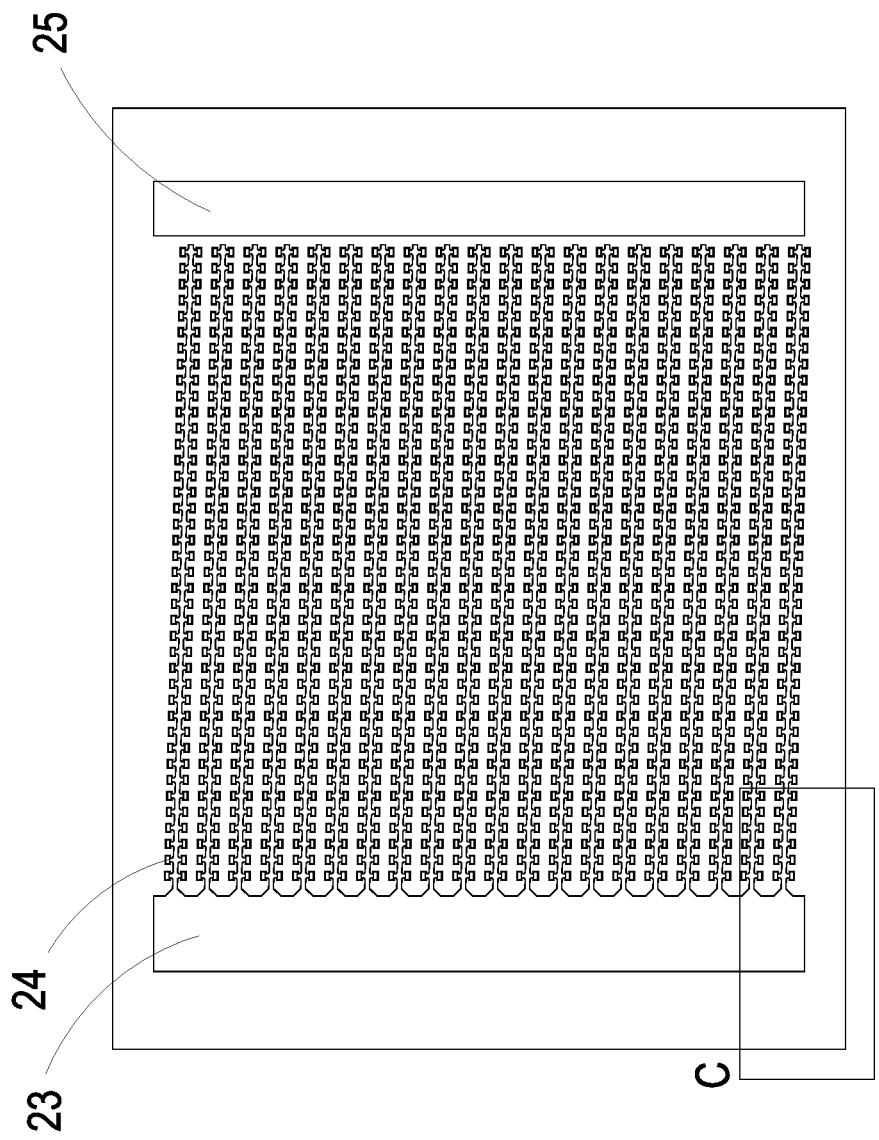
FIG. 4A is a schematic view illustrating the ink-supply channels, the manifolds and the ink-supply chamber arranged on the inkjet chip of the wafer structure according to the embodiment of the present disclosure.
Figure 4B:
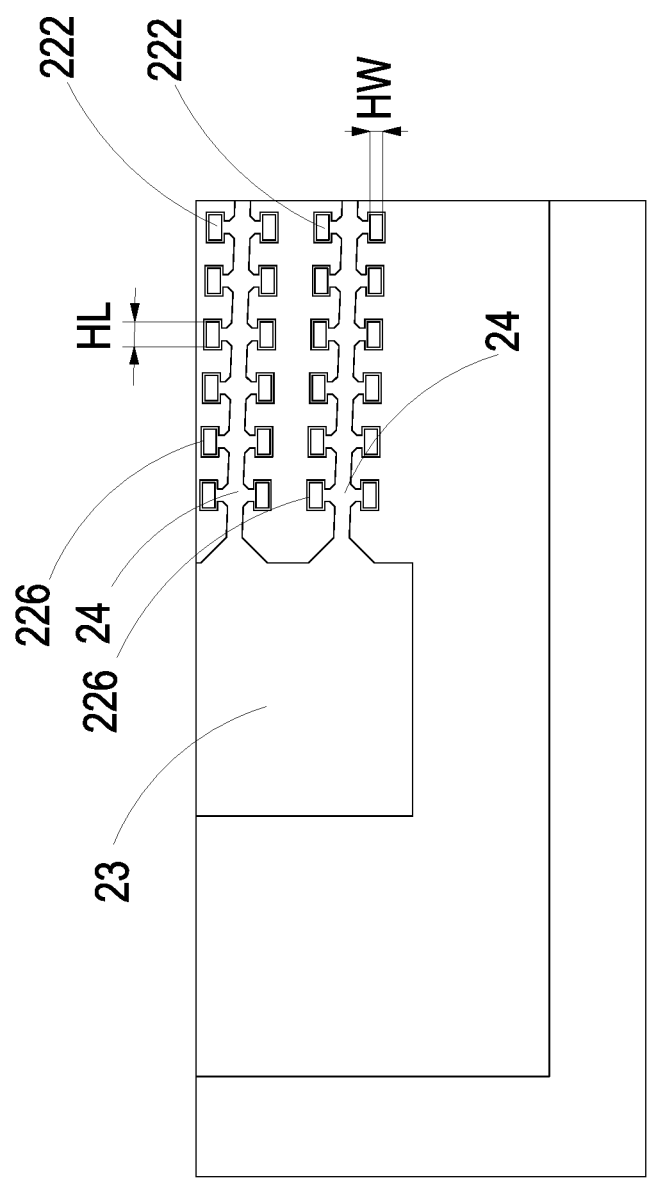
FIG. 4B is a partial enlarged view illustrating the region C of FIG. 4A.

Certainly, in the embodiment, the ink-drop generator 22 of the inkjet chip 21 is fabricated by the semiconductor process on the chip substrate 20. Furthermore, in the process of defining the required size by the lithographic etching process as shown in FIGS. 4A to 4B, at least one ink-supply channel 23 and a plurality of manifolds 24 are defined. Then, the ink-supply chamber 226 is formed on the protective layer 224 by dry film compression molding, and a dry film is coated to form the nozzle 227 by dry film compression molding, so that the barrier layer 225 is integrally formed on the protective layer 224 as shown in FIG. 3. Moreover, the ink-supply chamber 226 and the nozzle 227 are integrally formed in the barrier layer 225. In the embodiment, the bottom of the ink-supply chamber 226 is in communication with the protective layer 224, and the top of the ink-supply chamber 226 is in communication with the nozzle 227. The plurality of nozzles 227 are directly exposed on the surface of the inkjet chip 21 and arranged in the required arrangement, as shown in FIG. 4D. Therefore, the ink-supply channels 23 and the plurality of manifolds 24 are also fabricated by the semiconductor process at the same time. Each of the plurality of ink-supply channels 23 provides ink, and the ink-supply channel 23 is in communication with the plurality of manifolds 24. Moreover, the plurality of manifolds 24 are in communication with each of the ink-supply chambers 226 of the ink-drop generators 22. As shown in FIG. 4B, the resistance heating layer 222 is formed and exposed in the ink-supply chamber 226. The resistance heating layer 222 has a rectangular area formed with a length HL and a width HW. Notably, the length HL of the resistance heating layer 222 ranges from 5 microns to 30 microns, the width HW of the resistance heating layer 222 ranges from 5 microns to 10 microns, but not limited thereto. In other embodiments, the thickness, the length and the width of the resistance heating layer 222 is adjustable according to the requirement for the process.

Figure 4C:
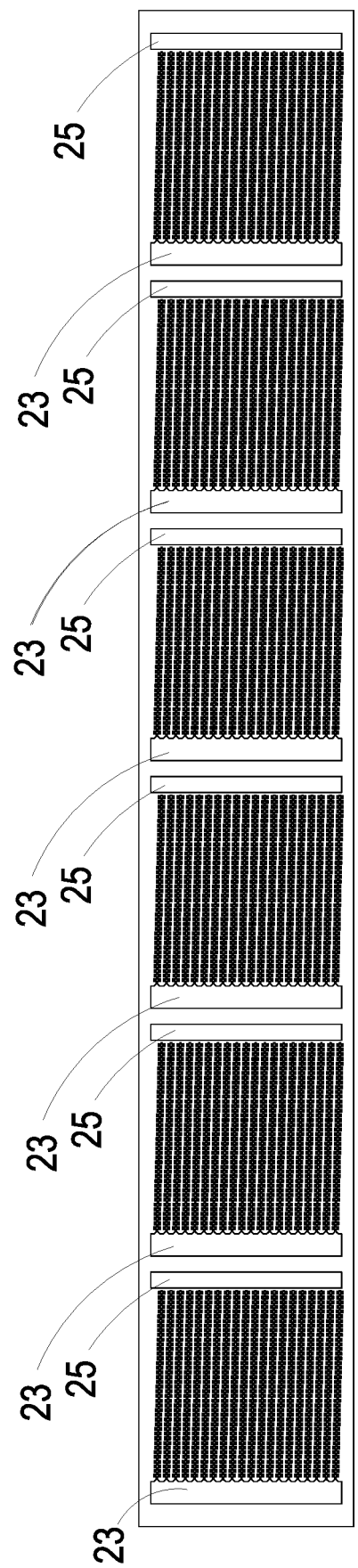
FIG. 4C is a schematic view illustrating the nozzles formed and arranged on the inkjet chip of FIG. 4A.

Please refer to FIGS. 4A and 4C. The number of the at least one ink-supply channel 23 may be one to six. As shown in FIG. 4A, the number of the at least one ink-supply channel 23 arranged on a single inkjet chip 21 is one, thereby providing monochrome ink. Preferably but not exclusively, the monochrome ink is selected from the group consisting of cyan, magenta, yellow and black ink. As shown in FIG. 4C, the number of the at least one ink-supply channel 23 arranged on a single inkjet chip 21 is six, thereby providing six-color ink of black, cyan, magenta, yellow, light cyan and light magenta, respectively. Certainly, in other embodiments, the number of the at least one ink-supply channel 23 arranged on a single inkjet chip 21 may be four, thereby providing four-color ink of cyan, magenta, yellow and black, respectively. The number of the ink-supply channels 23 is adjustable and can be designed according to the practical requirements.

Figure 5:
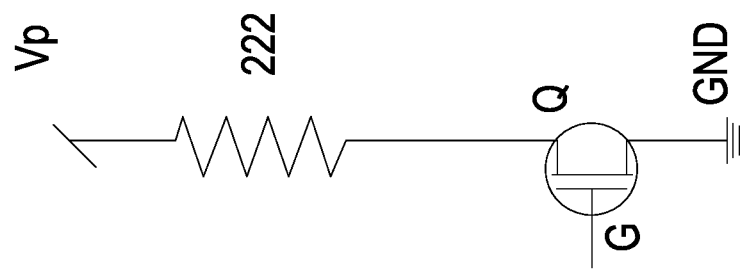
FIG. 5 is a schematic view illustrating the circuit diagram for heating the resistance heating layer under the control and excitement of the conductive layer according to the embodiment of the present disclosure.

Please refer to FIG. 3, FIG. 4A, FIG. 4C and FIG. 5. In the embodiment, the conductive layer 223 is fabricated by the semiconductor process on the wafer structure 2. Preferably but not exclusively, the conductors connected in the conductive layer 223 fabricated by the semiconductor process of less than 90 nanometers form an inkjet control circuit. In that, more metal oxide semiconductor field-effect transistors (MOSFETs) are arranged in the inkjet control circuit zone 25 to control the resistance heating layer 222. Therefore, the resistance heating layer 222 is activated for heating as the circuit is conducted. Alternatively, the resistance heating layer 222 is not activated for heating as the circuit is not conducted. That is, as shown in FIG. 5, when a voltage Vp is applied to the resistance heating layer 222, the transistor switch Q controls the circuit state of the resistance heating layer 222 grounded. When one end of the resistance heating layer 222 is grounded, a circuit is conducted to activate the resistance heating layer 222 for heating. Alternatively, if the circuit is not conducted, the resistance heating layer 22 is not grounded and not activated for heating. Preferably but not exclusively, the transistor switch Q is a metal oxide semiconductor field effect transistor (MOSFET), and the conductor connected by the conductive layer 223 is a gate G of the metal oxide semiconductor field effect transistor (MOSFET). In other embodiments, the conductor connected by the conductive layer 223 is a gate G of a complementary metal oxide semiconductor (CMOS). Alternatively, the conductor connected by the conductive layer 223 is a gate G of an N-type metal oxide semiconductor (NMOS), but not limited thereto. The conductor connected by the conductive layer 223 is adjustable and can be selected according to the practical requirements for the inkjet control circuit. Certainly, in an embodiment, the conductor connected by the conductive layer 223 is fabricated by the semiconductor process of 65 nanometers to 90 nanometers, to form the inkjet control circuit. In an embodiment, the conductor connected by the conductive layer 223 is fabricated by the semiconductor process of 45 nanometers to 65 nanometers, to form the inkjet control circuit. In an embodiment, the conductor connected by the conductive layer 223 is fabricated by the semiconductor process of 28 nanometers to 45 nanometers, to form the inkjet control circuit. In an embodiment, the conductor connected by the conductive layer 223 is fabricated by the semiconductor process of 20 nanometers to 28 nanometers, to form the inkjet control circuit. In an embodiment, the conductor connected by the conductive layer 223 is fabricated by the semiconductor process of 12 nanometers to 20 nanometers, to form the inkjet control circuit. In an embodiment, the conductor connected by the conductive layer 223 is fabricated by the semiconductor process of 7 nanometers to 12 nanometers, to form the inkjet control circuit. In an embodiment, the conductor connected by the conductive layer 223 is fabricated by the semiconductor process of 2 nanometers to 7 nanometers, to form the inkjet control circuit. It is understandable that the more sophisticated the semiconductor process technology is, the more groups of inkjet control circuits can be fabricated within the same unit volume.

As described above, the present disclosure provides the wafer structure 2 including the chip substrate 20 and the plurality of inkjet chips 21. The chip substrate 20 is fabricated by the semiconductor process, so that more inkjet chips 21 required can be arranged on the chip substrate 20. The plurality of inkjet chips 21 include at least one first inkjet chip 21A and at least one second inkjet chip 21B are directly formed on the chip substrate 20 by the semiconductor process and diced into the at least one first inkjet chip 21A and the at least one second inkjet chip 21B for inkjet printing. Thus, the first inkjet chip 21A and the second inkjet chip 21B having different sizes of printing swath Lp are directly produced in the same inkjet chip by semiconductor process. As shown in FIG. 2, when the wafer structure 2 is used to produce the chip substrate 20 by the semiconductor process, the remaining blank area after arranging the required number of second inkjet chips 21B can be used to arrange the first inkjet chip 21A with a smaller size of printing swath Lp, thus the remaining blank area won't be wasted, and the manufacturing cost of directly generating the first inkjet chip 21A and the second inkjet chip 21B having different sizes of printing swath Lp on the same wafer structure 2 on the same inkjet chip by semiconductor process can be effectively reduced. In addition, the first inkjet chip 21A and the second inkjet chip 21B used in a printing inkjet design for higher resolution and higher performance can be arranged based on the requirement.

The design of the resolution and the sizes of printing swath Lp of the first inkjet chip 21A and the second inkjet chip 21B are described below.

Figure 6:
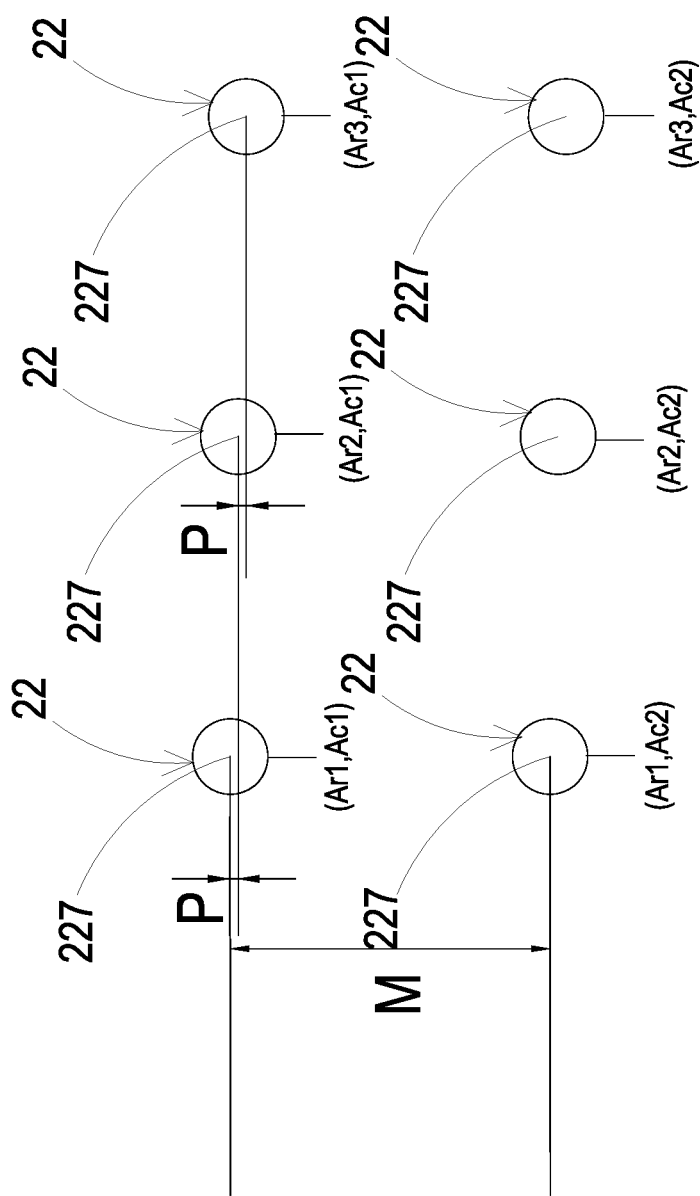
FIG. 6 is an enlarged view illustrating the ink-drop generators formed and arranged on the wafer structure according to the embodiment of the present disclosure.

As shown in FIGS. 4D and 6, each of the first inkjet chip 21A and the second inkjet chip 21B covers a rectangular area with a length L and a width W, and a printing swath Lp. In the embodiment, each of the first inkjet chip 21A and the second inkjet chip 21B includes a plurality of ink-drop generators 22 produced by the semiconductor process on the chip substrate 20. In the first inkjet chip 21A and the second inkjet chip 21B, the plurality of ink-drop generators 22 are arranged in the longitudinal direction to form a plurality of longitudinal axis array groups (Ar1 . . . Arn) having a pitch M maintained between two adjacent ink-drop generators 22 in the longitudinal direction; and the plurality of ink-drop generators 22 are also arranged in the horizontal direction to form a plurality of horizontal axis array groups (Ac1 . . . Acn) having a central stepped pitch P maintained between two adjacent ink-drop generators 22 in the horizontal direction. That is, as shown in FIG. 6, the pitch M is maintained between the ink-drop generator 22 with the coordinate (Ar1, Ac1) and the ink-drop generator 22 with the coordinate (Ar1, Ac2). Moreover, the central stepped pitch P is maintained between the ink-drop generator 22 with the coordinate (Ar1, Ac1) and the ink-drop generator 22 with the coordinate (Ar2, Ac1). The resolution number of dots per inch (DPI) for the inkjet chip 21 is equal to 1/(the central stepped pitch P). Therefore, in order to achieve the required higher resolution, a layout design with a resolution of at least 600 DPI is utilized in the present disclosure. Namely, the central stepped pitch P is at least equal to $1/600$ inches or less. Certainly, the resolution DPI of the inkjet chip 21 in the present disclosure can also be designed with at least 600 DPI to 1200 DPI. That is, the central stepped pitch P is equal to at least $1/600$ inches to $1/1200$ inches. Preferably but not exclusively, the resolution DPI of the inkjet chip 21 is designed with 720 DPI, and the central stepped pitch P is at least equal to $1/720$ inches or less. Preferably but not exclusively, the resolution DPI of the inkjet chip 21 in the present disclosure is designed with at least 1200 DPI to 2400 DPI. That is, the central stepped pitch P is equal to at least $1/1200$ inches to $1/2400$ inches. Preferably but not exclusively, the resolution DPI of the inkjet chip 21 in the present disclosure is designed with at least 2400 DPI to 24000 DPI. That is, the central stepped pitch P is equal to at least $1/2400$ inches to $1/24000$ inches. Preferably but not exclusively, the resolution DPI of the inkjet chip 21 in the present disclosure is designed with at least 24000 DPI to 48000 DPI. That is, the central stepped pitch P is equal to at least $1/24000$ inches to $1/48000$ inches.

In the embodiment, the first inkjet chip 21A disposed on the wafer structure 2 has a printing swath Lp ranges from at least 0.25 inches to 1.5 inches. Preferably but not exclusively, the printing swath Lp of the first inkjet chip 21A ranges from at least 0.25 inches to 0.5 inches. Preferably but not exclusively, the printing swath Lp of the first inkjet chip 21A ranges from at least 0.5 inches to 0.75 inches. Preferably but not exclusively, the printing swath Lp of the first inkjet chip 21A ranges from at least 0.75 inches to 1 inch. Preferably but not exclusively, the printing swath Lp of the first inkjet chip 21A ranges from at least 1 inch to 1.25 inches. Preferably but not exclusively, the printing swath Lp of the first inkjet chip 21A ranges from at least 1.25 inches to 1.5 inches. In the embodiment, the first inkjet chip 21A disposed on the wafer structure 2 has a width W ranging from at least 0.5 mm to 10 mm. Preferably but not exclusively, the width W of the first inkjet chip 21A ranges from at least 0.5 mm to 4 mm. Preferably but not exclusively, the width W of the first inkjet chip 21A ranges from at least 4 mm to 10 mm.

In the embodiment, a length constituted by a plurality of the second inkjet chips 21B disposed on the wafer structure 2 is equal to or greater than a width of a printing medium thereby constituting a page-width printing, and the second inkjet chip 21B has a printing swath Lp greater than at least 1.5 inches. Preferably but not exclusively, the printing swath Lp of the second inkjet chip 21B is 8.3 inches, and the extent of the page-width printing of the second inkjet chip 21B on the printing medium is 8.3 inches, corresponding to the width of the printing medium (A4 size) when the second inkjet chip 21B prints thereon. Preferably but not exclusively, the printing swath Lp of the second inkjet chip 21B is 11.7 inches, and the extent of the page-width printing of the second inkjet chip 21B on the printing medium is 11.7 inches, corresponding to the width of the printing medium (A3 size) when the second inkjet chip 21B prints thereon. Preferably but not exclusively, the printing swath Lp of the second inkjet chip 21B ranges from at least 1.5 inches to 2 inches, and the extent of the page-width printing of the second inkjet chip 21B on the printing medium ranges from at least 1.5 inches to 2 inches, corresponding to the width of the printing medium when the second inkjet chip 21B prints thereon. Preferably but not exclusively, the printing swath Lp of the second inkjet chip 21B ranges from at least 2 inches to 4 inches, and the extent of the page-width printing of the second inkjet chip 21B on the printing medium ranges from at least 2 inches to 4 inches, corresponding to the width of the printing medium when the second inkjet chip 21B prints thereon. Preferably but not exclusively, the printing swath Lp of the second inkjet chip 21B ranges from at least 4 inches to 6 inches, and the extent of the page-width printing of the second inkjet chip 21B on the printing medium ranges from at least 4 inches to 6 inches, corresponding to the width of the printing medium when the second inkjet chip 21B prints thereon. Preferably but not exclusively, the printing swath Lp of the second inkjet chip 21B ranges from at least 6 inches to 8 inches, and the extent of the page-width printing of the second inkjet chip 21B on the printing medium ranges from at least 6 inches to 8 inches, corresponding to the width of the printing medium when the second inkjet chip 21B prints thereon. Preferably but not exclusively, the printing swath Lp of the second inkjet chip 21B ranges from at least 8 inches to 12 inches, and the extent of the page-width printing of the second inkjet chip 21B on the printing medium ranges from at least 8 inches to 12 inches corresponding to the width of the printing medium when the second inkjet chip 21B prints thereon. Preferably but not exclusively, the printing swath Lp of the second inkjet chip 21B is greater than at least 12 inches, and the extent of the page-width printing of the second inkjet chip 21B on the printing medium is greater than at least 12 inches, corresponding to the width of the printing medium when the second inkjet chip 21B prints thereon.

In the embodiment, the second inkjet chip 21B disposed on the wafer structure 2 has a width W, which ranges from at least 0.5 mm to 10 mm. Preferably but not exclusively, the width W of the second inkjet chip 21B ranges from at least 0.5 mm to 4 mm. Preferably but not exclusively, the width W of the second inkjet chip 21B ranges from at least 4 mm to 10 mm.

In the present disclosure, the wafer structure 2 includes the chip substrate 20 and the plurality of inkjet chips 21 is provided. The chip substrate 20 is fabricated by the semiconductor process, so that a more inkjet chips 21 required can be arranged on the chip substrate 20. The plurality of inkjet chips 21 include at least one first inkjet chip 21A and at least one second inkjet chip 21B directly formed on the chip substrate 20 by the semiconductor process. The chip substrate 20 is diced into the at least one first inkjet chip 21A and the at least one second inkjet chip 21B for inkjet printing. Therefore, the plurality of inkjet chips 21 diced from the wafer structure 2 of the present disclosure, regardless of the first inkjet chip 21A and the second inkjet chip 21B of the inkjet chips 21, can be used for inkjet printing of a printhead 111. Please refer to FIG. 7. In the embodiment, the carrying system 1 is mainly used to support the structure of the printhead 111 in the present disclosure. The carrying system 1 includes a carrying frame 112, a controller 113, a first driving motor 116, a position controller 117, a second driving motor 119, a paper feeding structure 120 and a power source 121. The power source 121 provides electric energy for the operation of the entire carrying system 1. In the embodiment, carrying frame 112 is mainly used to accommodate the printhead 111 and includes one end connected with the first driving motor 116, so as to drive the printhead 111 to move along a linear track in the direction of a scanning axis 115. Preferably but not exclusively, the printhead 111 is detachably or permanently installed on the carrying frame 112. The controller 113 is connected to the carrying frame 112 to transmit a control signal to the printhead 111. Preferably but not exclusively, in the embodiment, the first driving motor 116 is a stepping motor. The first driving motor 116 is configured to move the carrying frame 112 along the scanning axis 115 according to a control signal sent by the position controller 117, and the position controller 117 determines the position of the carrying frame 112 on the scanning axis 115 through a storage device 118. In addition, the position controller 117 is also configured to control the operation of the second driving motor 119 to drive the paper feeding structure 120 and feed the printing medium 122, such as paper, so as to allow the printing medium 122 to move along the direction of a feeding axis 114. After the printing medium 122 is positioned in the printing area (not shown), the first driving motor 116 is driven by the position controller 117 to move the carrying frame 112 and the printhead 111 along the scanning axis 115 for printing on the printing medium 122. After one or more scanning is performed along the scanning axis 115, the position controller 117 controls the second driving motor 119 to drive the paper feeding structure 120 and feed the printing medium 122. As a result, the printing medium 122 is moved along the feeding axis 114 to place another area of the printing medium 122 into the printing area. Then, the first driving motor 116 drives the carrying frame 112 and the printhead 111 to move along the scanning axis 115 for performing another line of printing on the printing medium 122. When all the printing data is printed on the printing medium 122, the printing medium 122 is pushed out to an output tray (not shown) of the inkjet printer, so as to complete the printing procedure.

In summary, the present disclosure provides a wafer structure including a chip substrate and a plurality of inkjet chips. The chip substrate is fabricated by a semiconductor process, so that more inkjet chips required are arranged on the chip substrate. Furthermore, a first inkjet chip and a second inkjet chip having different sizes of printing swath are directly generated in the same inkjet chip by semiconductor process at the same time. Simultaneously, the ink-supply chamber and the nozzle of the ink-drop generator are integrally formed in a barrier layer during the semiconductor process for fabricating the ink-drop generator, so that such semiconductor process for fabricating the inkjet chips can arrange a layout of a printing inkjet design for higher resolution and higher performance. The wafer structure is diced into the first inkjet chip and the second inkjet chip used in inkjet printing to reduce the manufacturing cost of the inkjet chips and fulfill the pursuit of printing quality for higher resolution and higher printing speed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A wafer structure, comprising:
 a chip substrate, which is a silicon substrate, fabricated by a semiconductor process; and
 a plurality of inkjet chips comprising at least one first inkjet chip and at least one second inkjet chip directly formed on the chip substrate by the semiconductor process, respectively, wherein the plurality of inkjet chips are diced into the at least one first inkjet chip and the at least one second inkjet chip for inkjet printing;
 wherein each of the at least one first inkjet chip and the at least one second inkjet chip comprises:
  at least one ink-supply channel configured to provide ink; and
  a plurality of ink-drop generators respectively connected to the at least one ink-supply channel and formed on the chip substrate,
 wherein each of the ink-drop generators comprises a barrier layer, an ink-supply chamber and a nozzle, and the ink-supply chamber and the nozzle are integrally formed in the barrier layer;
 wherein each of the ink-drop generators further comprises a thermal-barrier layer, a resistance heating layer, a conductive layer and a protective layer, wherein the thermal-barrier layer is formed on the chip substrate, the resistance heating layer is formed on the thermal-barrier layer, the conductive layer and a part of the protective layer are formed on the resistance heating layer, and the barrier layer is directly formed on the protective layer, wherein the ink-supply chamber has a bottom in communication with the protective layer and a top in communication with the nozzle, wherein the thermal-barrier layer has a thickness ranging from 500 angstroms to 5000 angstroms, the protective layer has a thickness ranging from 150 angstroms to 3500 angstroms, the resistance heating layer has a thickness ranging from 100 angstroms to 500 angstroms, the resistance heating layer has a length ranging from 5 microns to 30 microns, and the resistance heating layer has a width ranging from 5 microns to 10 microns,
 wherein the barrier layer includes two opposite inner sidewalls defining two opposite sides of the ink-supply chamber, each of the two opposite inner sidewalls of the barrier layer continuously extends from a respective one of two opposite sides of a top surface of a continuous portion of the protective layer toward the nozzle, the two opposite inner sidewalls of the barrier layer entirely and directly overlap with the conductive layer in a direction normal to the bottom of the ink-supply chamber, and the top surface of the continuous portion of the protective layer is the bottom of the ink-supply chamber, and wherein an ink supply path is formed between the at least one ink-supply channel and the ink-supply chamber of each of the plurality of ink-drop generators, and the ink supply path is configured to supply the ink from the at least one ink-supply channel to the ink-supply chamber in a plane parallel with the bottom of the ink supply chamber.

2. The wafer structure according to claim 1, wherein a rest part of the protective layer is formed on the conductive layer.

3. The wafer structure according to claim 2, wherein the conductive layer is connected to a conductor to form an inkjet control circuit.

4. The wafer structure according to claim 2, wherein the conductive layer is connected to a conductor, and the conductor is a gate of a metal oxide semiconductor field effect transistor.

5. The wafer structure according to claim 2, wherein the conductive layer is connected to a conductor, and the conductor is a gate of a complementary metal oxide semiconductor.

6. The wafer structure according to claim 2, wherein the conductive layer is connected to a conductor, and the conductor is a gate of an N-type metal oxide semiconductor.

7. The wafer structure according to claim 1, wherein each of the at least one first inkjet chip and the at least one second inkjet chip further comprises a plurality of manifolds, wherein the at least one ink-supply channel is in communication with the plurality of the manifolds, and the plurality of manifolds are in communication with each of the ink-supply chambers of the ink-drop generators.

8. The wafer structure according to claim 1, wherein the first inkjet chip has a printing swath ranging from 0.25 inches to 1.5 inches, and the first inkjet chip has a width ranging from 0.5 mm to 10 mm.

9. The wafer structure according to claim 1, wherein the second inkjet chip has a width ranging from 0.5 mm to 10 mm.

10. The wafer structure according to claim 1, wherein a length constituted by the second inkjet chip is equal to or greater than a width of a printing medium thereby constituting a page-width printing, and the second inkjet chip has a printing swath equal to or greater than 1.5 inches.

11. The wafer structure according to claim 10, wherein the printing swath of the second inkjet chip is 8.3 inches, and the extent of the page-width printing of the second inkjet chip on the printing medium is 8.3 inches.

12. The wafer structure according to claim 10, wherein the printing swath of the second inkjet chip is 11.7 inches, and the extent of the page-width printing of the second inkjet chip on the printing medium is 11.7 inches.

13. The wafer structure according to claim 10, wherein the second inkjet chip has the printing swath ranging from 1.5 inches to 12 inches, and the extent of the page-width printing of the second inkjet chip on the printing medium is 1.5 inches to 12 inches.

14. The wafer structure according to claim 10, wherein the printing swath of the second inkjet chip ranges from 2 inches to 4 inches, and the extent of the page-width printing of the second inkjet chip on the printing medium ranges from 2 inches to 4 inches.

15. The wafer structure according to claim 10, wherein the printing swath of the second inkjet chip ranges from 4 inches to 6 inches, and the extent of the page-width printing of the second inkjet chip on the printing medium ranges from 4 inches to 6 inches.

16. The wafer structure according to claim 10, wherein the printing swath of the second inkjet chip ranges from 6 inches to 8 inches, and the extent of the page-width printing of the second inkjet chip on the printing medium ranges from 6 inches to 8 inches.

17. The wafer structure according to claim 10, wherein the printing swath of the second inkjet chip ranges from 8 inches to 12 inches, and the extent of the page-width printing of the second inkjet chip on the printing medium ranges from 8 inches to 12 inches.

18. The wafer structure according to claim 10, wherein the printing swath of the second inkjet chip is equal to or greater than 12 inches, and the extent of the page-width printing of the second inkjet chip on the printing medium is equal to or greater than 12 inches.

* * * * *